United States Patent
Luo et al.

(10) Patent No.: US 8,861,219 B2
(45) Date of Patent: Oct. 14, 2014

(54) PRINTED CIRCUIT BOARD FOR PROVIDING OPERATION VOLTAGES

(75) Inventors: Qi-Yan Luo, Shenzhen (CN); Zhou Yang, Shenzhen (CN); Song-Lin Tong, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 149 days.

(21) Appl. No.: 13/451,044

(22) Filed: Apr. 19, 2012

(65) Prior Publication Data

US 2013/0077273 A1    Mar. 28, 2013

(30) Foreign Application Priority Data

Sep. 26, 2011   (CN) .......................... 2011 1 0287839

(51) Int. Cl.
 H05K 7/10    (2006.01)
 H05K 1/02    (2006.01)
 H05K 1/11    (2006.01)

(52) U.S. Cl.
 CPC .............. *H05K 1/0262* (2013.01); *H05K 1/111* (2013.01)
 USPC .......................................... 361/767; 361/803

(58) Field of Classification Search
 CPC ........ H05K 1/02; H05K 1/0262; H05K 1/111
 USPC .......... 361/760, 767, 794, 803; 174/260, 262, 174/267; 257/531, E27.027
 See application file for complete search history.

(56) References Cited

U.S. PATENT DOCUMENTS

| | | | | |
|---|---|---|---|---|
| 5,420,493 | A  * | 5/1995 | Hargadon et al. | 320/106 |
| 6,833,690 | B2 * | 12/2004 | Walters et al. | 323/277 |
| 8,299,572 | B2 * | 10/2012 | Reisner | 257/531 |
| 2007/0241727 | A1 | 10/2007 | Luo et al. | |
| 2008/0008266 | A1* | 1/2008 | Kamali | 375/316 |
| 2009/0058386 | A1* | 3/2009 | Tarng et al. | 323/282 |
| 2012/0012377 | A1* | 1/2012 | Fan | 174/261 |
| 2012/0175731 | A1* | 7/2012 | Chen et al. | 257/531 |

FOREIGN PATENT DOCUMENTS

TW    200941907 A    10/2009

* cited by examiner

*Primary Examiner* — Yuriy Semenenko

(74) *Attorney, Agent, or Firm* — Novak Druce Connolly Bove + Quigg LLP

(57) ABSTRACT

A printed circuit board (PCB) includes two power supply units, a central processing unit (CPU), two inductors and a temperature compensation resistor. One of the inductor is electrically connected between one power supply unit and the CPU, the other inductor is electrically connected between another power supply unit and the CPU. The temperature compensation resistor is electrically connected between the power supply units and ground, and is positioned between the two inductors to adjust output voltage from the CPU.

19 Claims, 3 Drawing Sheets

PRINTED CIRCUIT BOARD FOR PROVIDING OPERATION VOLTAGES

BACKGROUND

1. Technical Field

The disclosure generally relates to a printed circuit board for providing operation voltages.

2. Description of the Related Art

In voltage output circuits, temperature compensation resistors are usually used and located adjacent to electronic components, such as inductors, to adjust and provide voltage compensation for the electronic components, and to further adjust output voltage of the voltage output circuits. However, if the temperature compensation resistors are positioned at an improper or inaccurate position on a printed circuit board, for example, too close or too far away from the electronic components, the temperature compensation resistors cannot carry out desired voltage compensation of the electronic components, which may result in inaccurate voltage output of the voltage output circuits.

Therefore, there is room for improvement within the art.

BRIEF DESCRIPTION OF THE DRAWINGS

Many aspects of a printed circuit board for providing operation voltage can be better understood with reference to the following drawings. The components in the drawings are not necessarily drawn to scale, the emphasis instead being placed upon clearly illustrating the principles of the printed circuit board for providing operation voltage. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
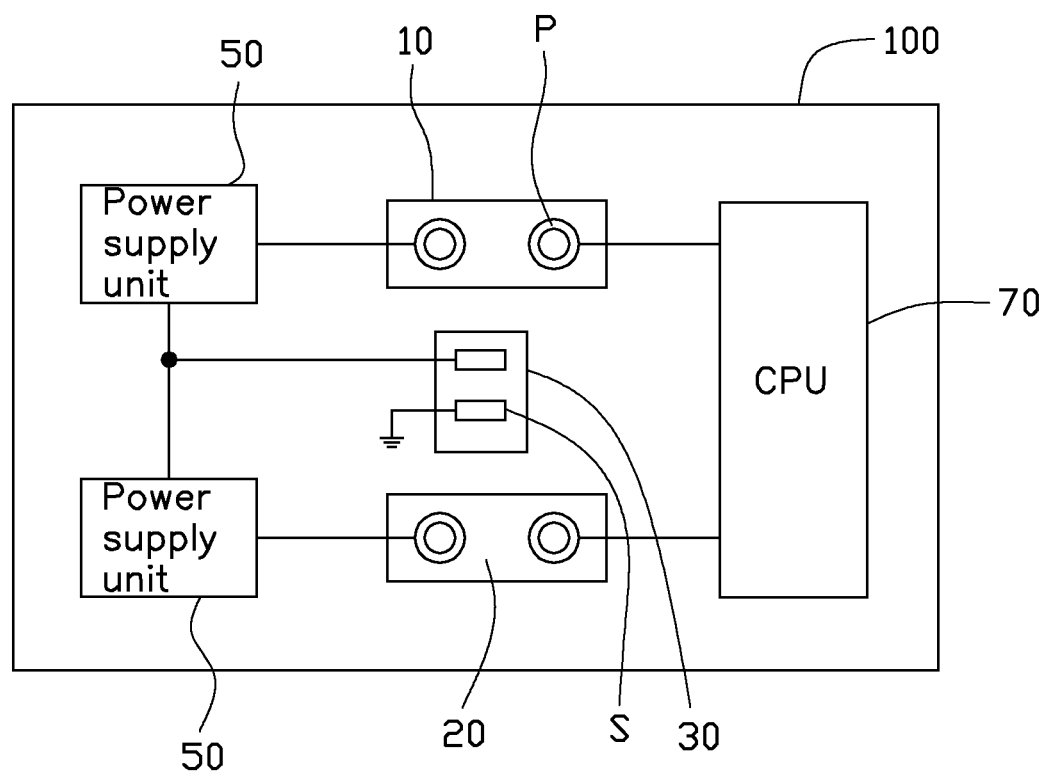
FIG. 1 is a schematic view of one embodiment of a printed circuit board (PCB) for providing operation voltage of the disclosure.

FIG. 1 is a schematic view of one embodiment of a printed circuit board (PCB) 100 for providing operation voltage of the disclosure. The PCB 100 is received within an electronic device (not shown), and is used to mechanically support and electrically connect electronic components using conductive pathways or signal tracks. In this embodiment, the electronic device can be a computer or server. The PCB 100 can be a motherboard of the electronic device.

Figure 2:
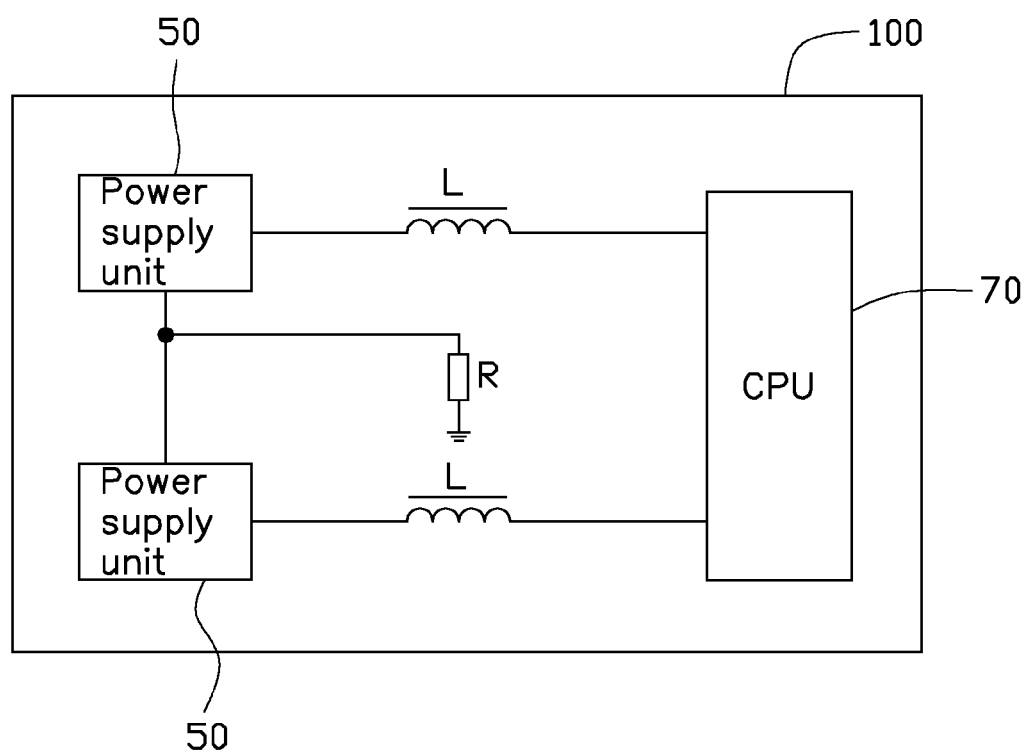
FIG. 2 is a schematic layout view of the PCB shown in FIG. 1 of the disclosure.

Also referring to FIG. 2, the PCB 100 includes a first inductor pad region 10, a second inductor pad region 20, a resistor pad region 30, two power supply units 50, a central processing unit (CPU) 70, and a plurality of electronic components (not shown), such as field-effect transistors. The first and inductor pad regions 10 and 20 each is configured for receiving an inductor. In one embodiment, two inductors L, which have small resistance values, are positioned on the inductor pad regions 10 and 20, respectively. Each of the inductor pad regions 10 and 20 includes two pads P, one of the pads P is electrically connected to one of the power supply units 50, and the other pad P is electrically connected to the CPU 70. Thus, each inductor L is electrically connected between the power supply unit 50 and the CPU 70.

In one embodiment, the center connection of two pads P of the first inductor pad region 10 is about parallel to the center connection of two pads P of the second inductor pad region 20. Each power supply unit 50 can output and provide an operation voltage for the CPU 70. The inductors L can be over current protection for the CPU 70 and other electronic components, and the temperature of the inductors L increases and varies significantly with current that flows along the inductors L.

The resistor pad region 30 can be configured for receiving resistors and is located between the two inductor pad regions 10 and 20. In this embodiment, a temperature compensation resistor R is positioned on the resistor pad region 30. The temperature compensation resistor R can be a negative temperature coefficient (NTC) thermistor whose resistance decreases with increasing temperature. The resistor pad region 30 includes two pads S, which are substantially rectangular and are parallel to each other along the length of the pad S. The two pads S are further parallel to each of the center connections between the pads P of each of the inductor pad regions 10 and 20 substantially along the length of the pads S.

In one embodiment, one pad S of the resistor pad region 30 is electrically connected to the power supply units 50 through the conductive pathway or signal track, and another pad S is electrically connected to ground through conductive pathway or signal track. Thus, the temperature compensation resistor R is mounted on the resistor pad region 30 and is electrically connected between the power supply units 50 and the ground.

The resistance of the temperature compensation resistor R is changeable and adjustable according to the temperature of the inductors L to adjust the output voltage of the power supply units 50 in an expected range. Thus, even if the resistance of the inductors L changes due to a change in temperature, resistance compensation of circuitry can also accomplished by the temperature compensation resistor R, so that the power supply units 50 can output and provide a desired operation voltage for the CPU 70 and other electronic components.

For example, when the temperature of the inductors L increase, the resistance of the temperature compensation resistor R decreases with the increasing temperature of the inductors L to reduce the output voltage of the power supply units 50. When the temperature of the inductors L decrease, the resistance of the temperature compensation resistor R increases with decreasing temperature of the inductors L, the output voltage of the power supply units 50 increases to fit the CPU 70. That is, when the resistor pad region 30 is located between the two inductor pad regions 10 and 20, the temperature compensation resistor R provides a desired resistance compensation for the circuitry, and the power supply units 40 can provide and output an expected operation voltage for the CPU 70 and the other electronic components.

Figure 3:
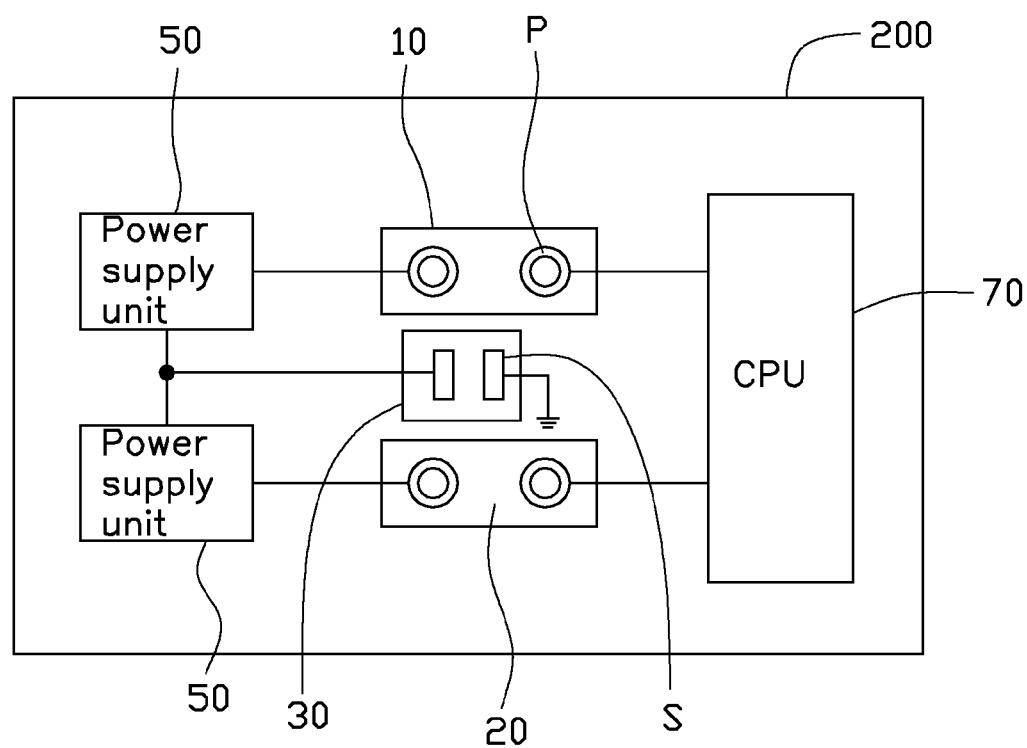
FIG. 3 is a schematic view of another embodiment of a PCB of the disclosure.

FIG. 3 is a schematic view of another embodiment of a PCB 200 of the disclosure. The PCB 200 is substantially similar as the PCB 100 of the first embodiment, except that: the distance between the two inductor pad regions 10 and 20 on the PCB 200 is shorter than that of the inductor pad regions 10 and 20 on the PCB 100 of the first embodiment, and the two pads S of the resistor pad region 230 are perpendicular to each of the center connections between the two pads P of each of the inductor pad regions 10 and 20 substantially along the length of the pads S on the PCB 200 of the second embodiment.

In the PCB 100, the resistor pad region 30 is located between the two inductor pad regions 10 and 20, and separated from each other, so that the temperature compensation resistor R can keep a suitable distance from the inductor L and the other electronic components. Furthermore, if the resistance of the temperature compensation resistor R is increased or decreased due to the temperature changes of the electronic components such as the inductors L, on the PCB of the electronic device to compensate the resistance of the circuitry on the PCB. The power supply units 50 can output and provide a desired operation voltage for the CPU 70 and the other electronic components.

In the present specification and claims, the word "a" or "an" preceding an element does not exclude the presence of a plurality of such elements. Further, the word "comprising" does not exclude the presence of elements or steps other than those listed.

It is to be understood, however, that even though numerous characteristics and advantages of the exemplary disclosure have been set forth in the foregoing description, together with details of the structure and function of the exemplary disclosure, the disclosure is illustrative only, and changes may be made in detail, especially in the matters of shape, size, and arrangement of parts within the principles of this exemplary disclosure to the full extent indicated by the broad general meaning of the terms in which the appended claims are expressed.

What is claimed is:

1. A printed circuit board (PCB), comprising:
   a first and second inductor pad regions receiving two corresponding inductors;
   a resistor pad region receiving a temperature compensation resistor electronically connected to the two inductors, the resistor pad region positioned between the first and second inductor pad regions, and resistance of the temperature compensation resistor being adjusted with the temperature changes of the inductors; and
   two power supply units and a central processing unit (CPU),
   wherein the first inductor pad region is electrically connected between the CPU and one of the two power supply units, and the second inductor pad region is electrically connected between the CPU and the other of the two power supply units, and the resistor pad region and the temperature compensation resistor are electrically connected to the power supply unit and ground.

2. The PCB as claimed in claim 1 wherein each of the first and second inductor pad regions comprises two pads, one of the two pads is electrically connected to one of the power supply units, and the other pad is electrically connected to the CPU, and each inductor is electrically connected between the power supply unit and the CPU.

3. The PCB as claimed in claim 2, wherein a center connection of the two pads of the first inductor pad region is parallel to the center connection of the two pads of the second inductor pad region, and each power supply unit outputs and provides an operation voltage for the CPU, and the temperature of the inductors increases and varies with current that flows along the inductors.

4. The PCB as claimed in claim 3, wherein the resistor pad region comprises two pads, the two pads of the resistor pad region are substantially rectangular and are parallel to each other, and are further parallel to the center connections between the pads of the first and second inductor pad regions, and one pad of the resistor pad region is electrically connected to the power supply units, and another pad of the resistor pad region is electrically connected to ground.

5. The PCB as claimed in claim 1, wherein the resistance of the temperature compensation resistor is changeable and adjustable according to the temperature changes of the inductors to adjust output voltage of the power supply units in an expected range, when the resistance of the inductors changes due to a change in temperature, the resistance of the temperature compensation resistor changes, and the power supply units outputs and provides a desired operation voltage for the CPU.

6. The PCB as claimed in claim 1, wherein the temperature compensation resistor is a negative temperature coefficient thermistor, when the temperature of the inductors increases, the resistance of the temperature compensation resistor decreases with the increasing temperature of the inductors to reduce the output voltage of the power supply units; when the temperature of the inductors decreases, the resistance of the temperature compensation resistor increases with decreasing temperature of the inductors, the output voltage of the power supply units increases to fit the CPU.

7. A printed circuit board (PCB) comprising:
   two power supply units;
   a central processing unit (CPU);
   two inductors, one inductor electrically connected between one power supply unit and the CPU, another inductor electrically connected between the other power supply unit and the CPU; and
   a temperature compensation resistor, wherein the temperature compensation resistor is electrically connected between the power supply units and ground, and is positioned between the two inductors to adjust output voltage from the CPU.

8. The PCB as claimed in claim 7, further comprising a first inductor pad region, a second inductor pad region and a resistor pad region, wherein the first inductor pad region is electrically connected between the CPU and one power supply unit to receive one inductor, and the second inductor pad region is electrically connected between the CPU and the other power supply unit to receive the other inductor, and the resistor pad region is electrically connected to the power supply unit and ground to receive the temperature compensation resistor.

9. The PCB as claimed in claim 8, wherein each of the first and second inductor pad regions comprises two pads, one of the two pads is electrically connected to one of the power supply units, and the other pad is electrically connected to the CPU.

10. The PCB as claimed in claim 9, wherein a center connection between the two pads of the first inductor pad region is parallel to the center connection between the two pads of the second inductor pad region, and each power supply unit outputs and provides an operation voltage for the CPU, the temperature of the inductors increases and varies with current that flows along the inductors.

11. The PCB as claimed in claim 10, wherein the resistor pad region comprises two pads, the two pads of the resistor pad region are substantially rectangular and are parallel to each other, and are further parallel to the center connections between the pads of the first and second inductor pad regions substantially along the long sides of the pads of the resistor pad region.

12. The PCB as claimed in claim 11, wherein one pad of the resistor pad region is electrically connected to the power supply units, and the other pad of the resistor pad region is electrically connected to ground, and the temperature compensation resistor is mounted on the resistor pad region and is electrically connected between the power supply units and the ground.

13. The PCB as claimed in claim 8, wherein the resistance of the temperature compensation resistor is changeable and adjustable according to the temperature changes of the inductors to adjust output voltage of the power supply units in an expected range, when the resistance of the inductors changes due to a change in temperature, the resistance of the temperature compensation resistor changes, and the power supply units outputs and provides a desired operation voltage for the CPU.

14. The PCB as claimed in claim 8, wherein the temperature compensation resistor is a negative temperature coefficient thermistor, when the temperature of the inductors increases, the resistance of the temperature compensation resistor decreases with the increasing temperature of the inductors to reduce the output voltage of the power supply units; when the temperature of the inductors decreases, the resistance of the temperature compensation resistor increases with decreasing temperature of the inductors, the output voltage of the power supply units increases to fit the CPU.

15. A printed circuit board (PCB) comprising:
two inductor pad regions receiving inductors;
a resistor pad region receiving a resistor electronically connected to the inductors;
two power supply units electrically connected to the resistor pad region and the inductor pad regions;
a central processing unit (CPU) electrically connected the inductor pad regions;
two inductors positioned on the corresponding inductor pad regions and electrically connected to the two power supply units and the CPU; and
a temperature compensation resistor electrically connected between the two power supply units and ground, wherein the resistor pad region is positioned between the inductor pad regions, and the temperature compensation resistor is located between the inductors, the resistance of the temperature compensation resistor is changed with the changing temperature of the inductors to adjust output voltage of the two power supply units for the CPU.

16. The PCB as claimed in claim 15, wherein each of the first and second inductor pad regions comprises two pads, one of the two pads is electrically connected to one of the power supply unit, the other pad is electrically connected to the CPU, a center connection of the two pads of the first inductor pad region is parallel to the center connection of the two pads of the second inductor pad region, and each power supply unit outputs and provides an operation voltage for the CPU, and the temperature of the inductors increases and varies with current that flows along the inductors.

17. The PCB as claimed in claim 16, wherein the resistor pad region comprises two pads, the two pads of the resistor pad region are substantially rectangular and are parallel to each other, and are further parallel to the center connections between the pads of the first and second inductor pad regions, and one pad of the resistor pad region is electrically connected to the power supply units, and another pad of the resistor pad region is electrically connected to ground, the temperature compensation resistor is mounted on the resistor pad region and is electrically connected between the power supply units and the ground.

18. The PCB as claimed in claim 15, wherein the resistance of the temperature compensation resistor is changeable and adjustable according to the temperature changes of the inductors to adjust output voltage of the power supply units in an expected range, when the resistance of the inductors changes due to a change in temperature, the resistance of the temperature compensation resistor changes, and the power supply unit units outputs and provides a desired operation voltage for the CPU.

19. The PCB as claimed in claim 15, wherein the temperature compensation resistor is a negative temperature coefficient thermistor, when the temperature of the inductors increases, the resistance of the temperature compensation resistor decreases with the increasing temperature of the inductors to reduce the output voltage of the power supply units; when the temperature of the inductors decreases, the resistance of the temperature compensation resistor increases with decreasing temperature of the inductors, the output voltage of the power supply units increases to fit the CPU.

* * * * *